United States Patent

Augustus et al.

[11] Patent Number: 5,821,544
[45] Date of Patent: Oct. 13, 1998

[54] ELECTRON MICROSCOPE SPECIMEN SUPPORTS

[75] Inventors: Peter D Augustus, Rugby; Muhammad M Ahmed, Canley, both of United Kingdom

[73] Assignee: GEC-Marconi Limited, Middlesex, United Kingdom

[21] Appl. No.: 703,979

[22] Filed: Aug. 28, 1996

[30] Foreign Application Priority Data

Sep. 8, 1995 [GB] United Kingdom ............ 9518329

[51] Int. Cl.$^6$ ........................................ H01J 37/20
[52] U.S. Cl. ........................................ 250/440.11
[58] Field of Search ............. 250/440.11, 310, 250/311; 427/450, 577; 423/446; 117/103, 929

[56] References Cited

U.S. PATENT DOCUMENTS

| | | | |
|---|---|---|---|
| 4,250,127 | 2/1981 | Warren et al. | 264/22 |
| 4,851,254 | 7/1989 | Yamamoto et al. | 427/37 |
| 5,275,798 | 1/1994 | Aida | 423/446 |
| 5,374,318 | 12/1994 | Rabalais et al. | 148/33 |
| 5,458,754 | 10/1995 | Sathrum et al. | 204/192.38 |

FOREIGN PATENT DOCUMENTS

| | | |
|---|---|---|
| 0 556 615 A2 | 8/1993 | European Pat. Off. . |
| 57-145260 A | 9/1982 | Japan . |

OTHER PUBLICATIONS

IBM Technical Disclosure Bulletin, vol. 23, No. 5, Oct. 1980, New York, US, pp. 2140–2141, XP002020102, Krakow, et al., "Microgrids for Electron Microscopy, Oct. 1980.".

*Primary Examiner*—Kiet T. Nguyen
*Attorney, Agent, or Firm*—Kirschstein, et al.

[57] ABSTRACT

A specimen support for use in an electron microscope comprises a deposited diamond film. The film is deposited on a substrate using a plasma assisted chemical vapor deposition process and then machined to a desired configuration using a laser machining process. Molybdenum, tungsten or silicon are used as substrates.

20 Claims, 1 Drawing Sheet

ELECTRON MICROSCOPE SPECIMEN SUPPORTS

BACKGROUND OF THE INVENTION

This invention relates to specimen supports for use in electron microscopes.

In operation of electron microscopes, more especially transmission electron microscopes, the specimens being examined are often very thin, e.g. less than 100 nm thick, and therefore need to be mounted on a support to restrain them physically and to aid handling during preparatory treatments. Commonly, supports in the form of copper grids are used for this purpose, a variety of mesh sizes being used, and in some cases a support with very few holes or slots, or even one hole or slot only, may be used. Supports made of other materials have also been used to suit various special applications, for example, supports made of beryllium have been used where low x-ray background is desirable.

SUMMARY OF THE INVENTION

It is an object of the present invention to provide a specimen support for use in an electron microscope which exhibits significant advantages in various applications.

According to the present invention there is provided a specimen support for use in an electron microscope comprising a deposited diamond film.

Suitably the film is a film formed by chemical vapour deposition.

The invention also provides a method of fabricating a specimen support for use in an electron microscope comprising depositing a film of diamond on a substrate using a plasma assisted chemical vapour deposition process and machining the film to a desired configuration using a laser machining process.

DETAILED DESCRIPTION OF THE PREFERRED EMBODIMENTS

Figure 1:
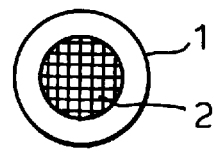
FIG. 1 is a top plan view of a specimen support according to this invention.

Various specimen supports in accordance with the invention and their method of fabrication will now be described, by way of example.

The supports are of planar circular form with an outside diameter of 3.05 mm so as to fit into the holders normally provided by electron microscope manufacturers.

The supports have formed through them one or more apertures. Typically a regular pattern of circular or rectangular apertures is formed. Alternatively, a single circular central aperture of desired diameter is formed.

The supports typically have a thickness of between 50 $\mu$m and 75 $\mu$m although thinner supports and supports of thickness up to 1.5 mm can be fabricated.

The supports are formed by microwave plasma chemical vapour deposition of diamond films on a substrate, followed by laser machining to form the required apertures and define the outer periphery.

In a preferred fabrication process deposition takes place at 1000° C. onto a molybdenum substrate and the gas in the plasma consists of a mixture of hydrogen ($H_2$) at a flow rate of 532 sccm (standard cubic centimeters per minute), methane ($CH_4$) at a flow rate of 60 sccm and oxygen ($O_2$) at a flow rate of 9 sccm, at a pressure of 140 torr. Under these conditions the growth rate is about 14.5 $\mu$m per hour.

After deposition the film is easily removed from the molybdenum substrate and the free-standing diamond film machined using a Nd/YAG laser operated at a wavelength of 1064 nm. Instead of a Na/YAG laser a copper vapour laser may be used.

Tungsten may suitably be used for the substrate instead of molybdenum.

Where a very thin support is required a silicon substrate can be used and removed by chemical etching after laser machining of the support.

One advantage of a specimen support according to the invention arises from the high thermal conductivity of diamond, which is five times that of copper. This makes a support according to the invention ideal for use as a support for a cross-section transmission electron microscope specimen of thermally sensitive material, which may be subject to thermal damage during ion beam milling when being prepared for examination. Furthermore, heat generated during electron optical observations in the microscope is conducted away rapidly by a support according to the invention.

Another advantage of a support according to the invention is its low sputter rate, e.g. during ion beam milling of the specimen. This leads to cleaner specimens because of the low contamination due to sputtered material from the support. This also has the effect that a specimen will be etched faster than its support. The possibility of the support being etched away and the specimen falling into the ion beam milling apparatus is therefore avoided. The lower sputter rate of supports according to the invention also allows supports of finer grid form to be used.

A further advantage of a support according to the invention is that, being formed of material of low atomic number, i.e. Z=6, it produces a low energy background signal when used to support a specimen for energy dispersive x-ray EDX) analysis. Beryllium supports have been used for this purpose, but beryllium is toxic. Graphitised fibre supports have also been used but are too brittle to be made to precise dimensions.

A further advantage of a support according to the invention is its chemical inertness. As a consequence a specimen can be cleaned by chemical etching whilst mounted on the support. Moreover, a support can often be re-used after being chemically cleaned.

Finally a support according to the invention is hard and rigid and mechanically very stable, properties not found in materials conventionally used for electron microscope specimen support.

Figure 2:
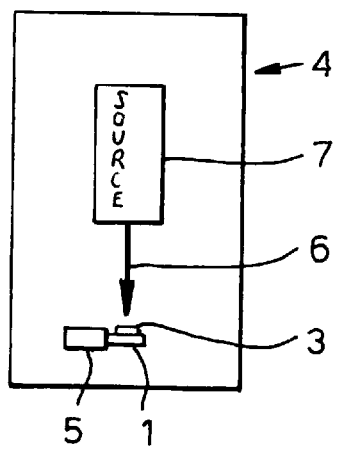
FIG. 2 is a diagrammatic view of the support of FIG. 1 during use with an electron microscope.

Turning now to the drawings, FIG. 1 depicts a specimen support (1) having formed therethrough a regular pattern of rectangular apertures (2). FIG. 2 shows examination of a specimen (3) in an electron microscope (4). The specimen (3) rests on, and is supported by, a specimen support (1) which is, in turn, held in a holder (5). During examination, the specimen (3) is subject to an electron beam (6) originating from an electron beam source (7).

Figures 3A, 3B:
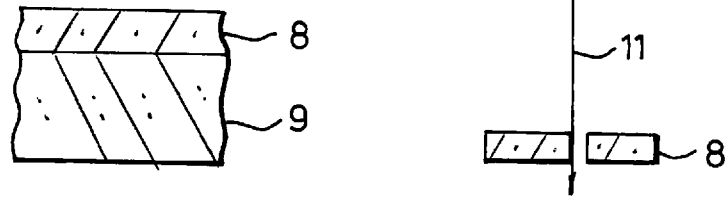
FIG. 3(a) is a broken-away sectional view of a diamond film on a substrate at an initial stage of the manufacture of the support of FIG. 1.
FIG. 3(b) is a diagrammatic view of the laser machining of the diamond film during a subsequent stage of the manufacture of the support of FIG. 1.

The steps involved in making the specimen support (1) are shown in FIGS. 3(a) and 3(b). FIG. 3(a) shows a film (8)

of diamond material deposited on a substrate (9). The process of plasma assisted chemical vapor deposition may conveniently be used. After the film (8) has been deposited, it is removed from the substrate (9) by chemical etching. The next step is shown in FIG. 3(b) in which the resultant free-standing diamond film (8) is machined using a Nd/YAG laser (10) to produce the specimen support (1) as shown in FIG. 1. The laser (10) forms the required apertures (2) and defines the outer periphery of the specimen support (1). In FIG. 3(b), the laser (10) is shown using a laser beam (11) to machine an aperture (2) in the diamond film (8).

We claim:

1. In an electron microscope having a holder for examining a specimen by electron microscopy, a specimen support for engaging the holder and for supporting the specimen during examination, said specimen support consisting essentially of a free-standing, rigid film of a diamond material, said diamond material extending throughout said film.

2. The specimen support according to claim 1, wherein the film has a planar, circular shape.

3. The specimen support according to claim 2, wherein the circular film has a diameter on the order of 3 millimeters.

4. The specimen support according to claim 1, wherein the film has at least one aperture extending therethrough.

5. The specimen support according to claim 1, wherein the film has a plurality of apertures extending therethrough.

6. The specimen support according to claim 1, wherein the film has a thickness in a range from 50 $\mu$m to 75 $\mu$m.

7. The specimen support according to claim 1, wherein the film has a conductivity for use in a transmission electron microscope.

8. A method of making a specimen support for supporting a specimen during examination by an electron microscope, comprising the steps of:
   a) providing a substrate;
   b) depositing a film of a diamond material on the substrate, said diamond material extending throughout said film; and
   c) separating the film from the substrate to form a separated, free-standing, rigid diamond film to serve as the specimen support.

9. The method according to claim 8, wherein the depositing step is performed by plasma-assisted, chemical vapor deposition.

10. The method according to claim 9, wherein the depositing step is performed by exposing the substrate to a plasma gas comprising a mixture of hydrogen, methane and oxygen.

11. The method according to claim 10, wherein the depositing step is performed by pressurizing the gas to a pressure of substantially 140 torr.

12. The method according to claim 10, wherein the hydrogen, methane and oxygen are fed into the plasma gas at flow rates of substantially 532, 60 and 9 standard cubic centimeters per minute, respectively.

13. The method according to claim 10, wherein the depositing step is performed at a temperature of substantially 1000° C.

14. The method according to claim 10, wherein the depositing step is performed at a growth rate of substantially 14.5 $\mu$m per hour.

15. The method according to claim 8, wherein the providing step is performed by providing the substrate of a material selected from the group consisting of molybdenum, tungsten and silicon.

16. The method according to claim 8, wherein the separating step is performed by chemically etching the substrate to leave behind the free-standing diamond film.

17. The method according to claim 8, and further comprising the step of laser machining the film to a desired configuration.

18. The method according to claim 17, wherein the separating step is performed prior to performing the laser machining step.

19. The method according to claim 17, wherein the separating step is performed after performing the laser machining step.

20. The method according to claim 17, wherein the laser machining step includes the step of forming apertures through the film.

* * * * *